United States Patent
Fujii et al.

(10) Patent No.: US 9,978,906 B2
(45) Date of Patent: May 22, 2018

(54) SEMICONDUCTOR LIGHT-EMITTING ELEMENT

(71) Applicants: STANLEY ELECTRIC CO., LTD., Meguro-ku, Tokyo (JP); THE UNIVERSITY OF TOKYO, Bunkyo-ku, Tokyo (JP)

(72) Inventors: Yusaku Fujii, Tokyo (JP); Masakazu Sugiyama, Tokyo (JP); Mathew Manish, Tokyo (JP)

(73) Assignees: STANLEY ELECTRIC CO., LTD., Tokyo (JP); THE UNIVERSITY OF TOKYO, Tokyo (JP)

( * ) Notice: Subject to any disclaimer, the term of this patent is extended or adjusted under 35 U.S.C. 154(b) by 0 days. days.

(21) Appl. No.: 15/525,054

(22) PCT Filed: Oct. 22, 2015

(86) PCT No.: PCT/JP2015/079808
§ 371 (c)(1),
(2) Date: May 6, 2017

(87) PCT Pub. No.: WO2016/072278
PCT Pub. Date: May 12, 2016

(65) Prior Publication Data
US 2018/0033911 A1    Feb. 1, 2018

(30) Foreign Application Priority Data
Nov. 7, 2014 (JP) .................................. 2014-226940

(51) Int. Cl.
*H01L 33/06* (2010.01)
*H01L 33/32* (2010.01)
(Continued)

(52) U.S. Cl.
CPC ............ *H01L 33/06* (2013.01); *H01L 33/007* (2013.01); *H01L 33/0025* (2013.01);
(Continued)

(58) Field of Classification Search
CPC ......... H01L 33/06; H01L 33/20; H01L 33/22; H01L 33/24; H01L 33/0062–33/0079; H01L 33/0025; H01L 33/002
See application file for complete search history.

(56) References Cited

U.S. PATENT DOCUMENTS

2005/0056850 A1   3/2005  Taki
2006/0267026 A1   11/2006  Kim et al.
(Continued)

FOREIGN PATENT DOCUMENTS

JP    2004179493 A    6/2004
JP    2005093682 A    4/2005
(Continued)

OTHER PUBLICATIONS

International Search Report (ISR) and Written Opinion dated Dec. 15, 2015 issued in International Application No. PCT/JP2015/079808.
(Continued)

*Primary Examiner* — Tucker J Wright
(74) *Attorney, Agent, or Firm* — Holtz, Holtz & Volek PC

(57) ABSTRACT

A semiconductor light-emitting element includes a first semiconductor layer of a first conductivity type; a light-emitting functional layer that includes a light-emitting layer; and a second semiconductor layer that is formed on the light-emitting functional layer and is of a conductivity type opposite to a conductivity type of the first semiconductor layer. The light-emitting layer includes a base layer which has a composition subject to stress strain from the first semiconductor layer and has a plurality of base segments (Continued)

that are partitioned in a random net shape; and a quantum well structure layer composed of at least one quantum well layer and at least one barrier layer. The base layer has a composition of $Al_xGa_{1-x}N$ ($0 \leq x \leq 1$), and the barrier layer has a composition of $Al_yGa_{1-y}N$ ($0 \leq y < 1$), and the composition x and the composition y satisfy a relation of x>y.

6 Claims, 4 Drawing Sheets

(51) Int. Cl.
    *H01L 33/24*     (2010.01)
    *H01L 33/00*     (2010.01)
    *H01L 33/14*     (2010.01)
    *H01L 33/12*     (2010.01)

(52) U.S. Cl.
    CPC .............. *H01L 33/24* (2013.01); *H01L 33/32* (2013.01); *H01L 33/12* (2013.01); *H01L 33/145* (2013.01)

(56) References Cited

U.S. PATENT DOCUMENTS

| | | |
|---|---|---|
| 2008/0073657 A1 | 3/2008 | Liang et al. |
| 2008/0191190 A1 | 8/2008 | Tsai et al. |
| 2009/0014713 A1 | 1/2009 | Kang et al. |
| 2009/0121214 A1 | 5/2009 | Tu et al. |
| 2009/0173955 A1 | 7/2009 | Kim et al. |
| 2010/0155704 A1 | 6/2010 | Oh et al. |
| 2010/0289043 A1 | 11/2010 | Aurelien et al. |
| 2011/0210312 A1 | 9/2011 | Tu et al. |
| 2011/0297955 A1 | 12/2011 | Wang et al. |
| 2012/0056157 A1 | 3/2012 | Hikosaka et al. |
| 2012/0077298 A1 | 3/2012 | Liang et al. |
| 2017/0317232 A1 | 11/2017 | Togawa et al. |

FOREIGN PATENT DOCUMENTS

| | | |
|---|---|---|
| JP | 2006339646 A | 12/2006 |
| JP | 2008053608 A | 3/2008 |
| JP | 2008071805 A | 3/2008 |
| JP | 2008199016 A | 8/2008 |
| JP | 2008218746 A | 9/2008 |
| JP | 2009124149 A | 6/2009 |
| JP | 2011249460 A | 12/2011 |
| JP | 4984119 B2 | 7/2012 |
| KR | 100809229 B1 | 3/2008 |

OTHER PUBLICATIONS

Applied Physics Letters 92, 261909 (2008).
U.S. Appl. No. 15/525,057; First Named Inventor. Hiroyuki Togawa; Title: "Semiconductor Light-Emitting Device"; filed May 6, 2017.
U.S. Appl. No. 15/561,028; First Named Inventor: Hiroyuki Togawa; Title: "Semiconductor Light-Emitting Element, and Manufacturing Method for Same"; filed Sep. 22, 2017.
U.S. Appl. No. 15/525,055; First Named Inventor: Takado Fujiwara; Title: "Semiconductor Light-Emitting Element"; filed May 6, 2017.
U.S. Appl. No. 15/525,056; First Named Inventor: Meiki Goto; Title: "Semiconductor Light-Emitting Element"; filed May 6, 2017.
U.S. Appl. No. 15/525,055, filed May 6, 2017; published as US 2017/0324047.
U.S. Appl. No. 15/525,056, filed May 6, 2017; published as US 2017/0324048.
U.S. Appl. No. 15/525,057, filed May 6, 2017; published as US 2017/0317232.
U.S. Appl. No. 15/561,028, filed Sep. 27, 2017.

(a)

(b)

SEMICONDUCTOR LIGHT-EMITTING ELEMENT

TECHNICAL FIELD

The present invention relates to a semiconductor light-emitting element, such as a light-emitting diode (LED).

BACKGROUND ART

A semiconductor light-emitting element is usually manufactured by growing, on a growth substrate, a semiconductor structure layer composed of an n-type semiconductor layer, an active layer, and a p-type semiconductor layer and forming an n electrode and a p electrode that apply voltage to the n-type semiconductor layer and the p-type semiconductor layer, respectively.

Patent Literature 1 discloses a white light-emitting diode in which red, green, and blue light-emitting diodes are laminated in this order so as to emit light in the same direction. Patent Literature 2 discloses a white light-emitting element including: a first light-emitting portion bonded to a conductive sub-mount substrate by a metal layer; and a second light-emitting portion formed on one region of the upper surface of the conductive sub-mount substrate. Patent Literature 3 discloses a semiconductor light-emitting element including a plurality of well layers composed of InGaN in which the In compositions of the respective well layers are different.

CITATION LIST

Patent Literature

Patent Literature 1: Japanese Patent Application Laid-Open No. 2011-249460
Patent Literature 2: Japanese Patent Application Laid-Open No. 2006-339646
Patent Literature 3: Japanese Patent Application Laid-Open No. 2004-179493

SUMMARY OF INVENTION

Technical Problem

Emission of light by a semiconductor light-emitting element is induced when binding (recombination) of an electron and a hole injected into the element through electrodes occurs in the active layer of the element. The wavelength of the light emitted from the active layer (i.e. light-emitting color) differs depending on the band gap of the semiconductor materials that make up the active layer. For example, a light-emitting element using a nitride-based semiconductor emits blue light from its active layer.

A light source is required to have color rendering properties for, for example, lighting applications. A light source with high color rendering properties is a type of light source that emits near natural light. To achieve high color rendering properties, it is preferable that light emitted from a light source have a wavelength that substantially covers the entire wavelength of the visible region. For example, light extracted from a light source with high color rendering properties is observed as white light.

In this regard, as disclosed in the aforementioned patent literatures, various methods of using a semiconductor light-emitting element to extract white light have been proposed. In one example method of manufacturing a light-emitting device, a wavelength conversion component, such as a phosphor, is mixed into a sealing resin to seal the element by the sealing resin. For example, in the case of a semiconductor light-emitting element using an active layer that emits blue light, a part of blue light from the active layer is converted into yellow light by a phosphor, and the two types of light are mixed and emitted to the outside. The emitted light as a whole is thus observed as white light. In another proposed technique, by laminating a plurality of active layers with different compositions, the light emission wavelength range is widened without using a phosphor.

However, a light-emitting device manufactured using the aforementioned methods has problems relating to the uniformity of the light-emitting wavelength within the device, the complexity of the manufacturing process, and light-emitting intensity. Possible reasons include: addition of a phosphor mixing step; change of the wavelength conversion efficiency of a phosphor over time, addition of a processing step of a semiconductor layer, and deterioration of crystallinity due to processing of a semiconductor layer.

The present invention has been made in view of the aforementioned problems. An object of the present invention is to provide a semiconductor light-emitting element that does not require a wavelength conversion component, such as a phosphor, and that has a light-emitting wavelength band (spectral width) over a wide range of the visible region and has high color rendering properties and a high light-emitting intensity.

According to one aspect of the present invention, a semiconductor light-emitting element includes: a first semiconductor layer of a first conductivity type; a light-emitting functional layer that is formed on the first semiconductor layer and includes a light-emitting layer; and a second semiconductor layer that is formed on the light-emitting functional layer and is of a conductivity type opposite to a conductivity type of the first semiconductor layer, wherein the light-emitting layer includes: a base layer which has a composition subject to stress strain from the first semiconductor layer and has a plurality of base segments that are partitioned in a random net shape; and a quantum well structure layer formed on the base layer and composed of at least one quantum well layer and at least one barrier layer, and the base layer has a composition of $Al_xGa_{1-x}N$ ($0 \le x \le 1$), the at least one barrier layer has a composition of $Al_yGa_{1-y}N$ ($0 \le y < 1$), and the composition x and the composition y satisfy a relation of $x > y$.

DESCRIPTION OF EMBODIMENTS

Figure 1:
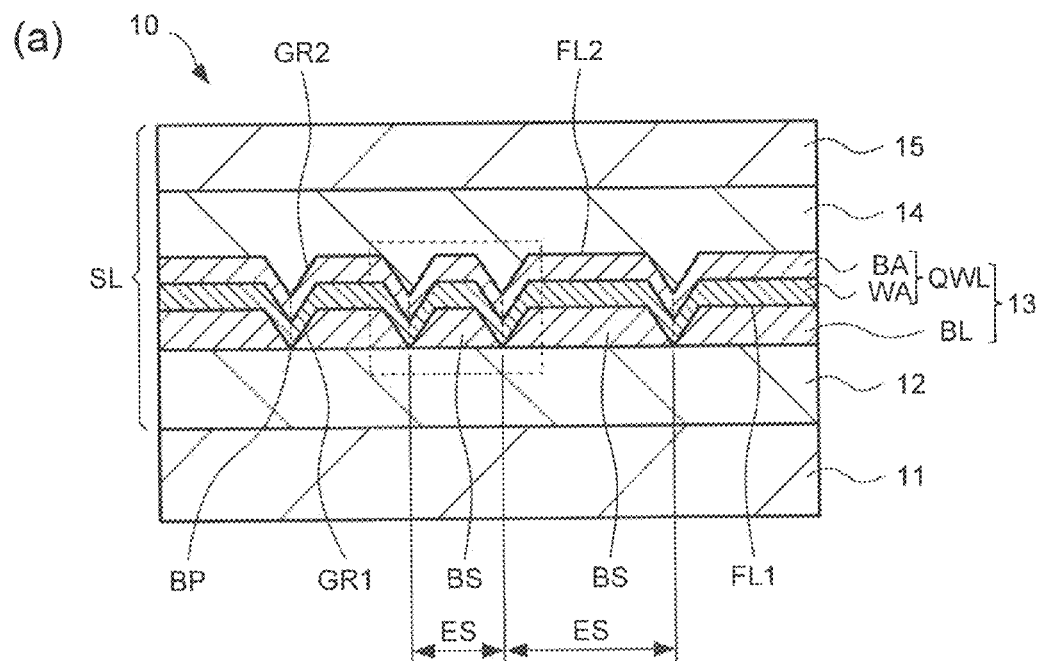
FIG. 1(a) is a cross-sectional view illustrating a structure of a semiconductor light-emitting element according to a first embodiment.
FIG. 1(b) is a schematic top plan view of a base layer of a light-emitting layer.
Figure 1:
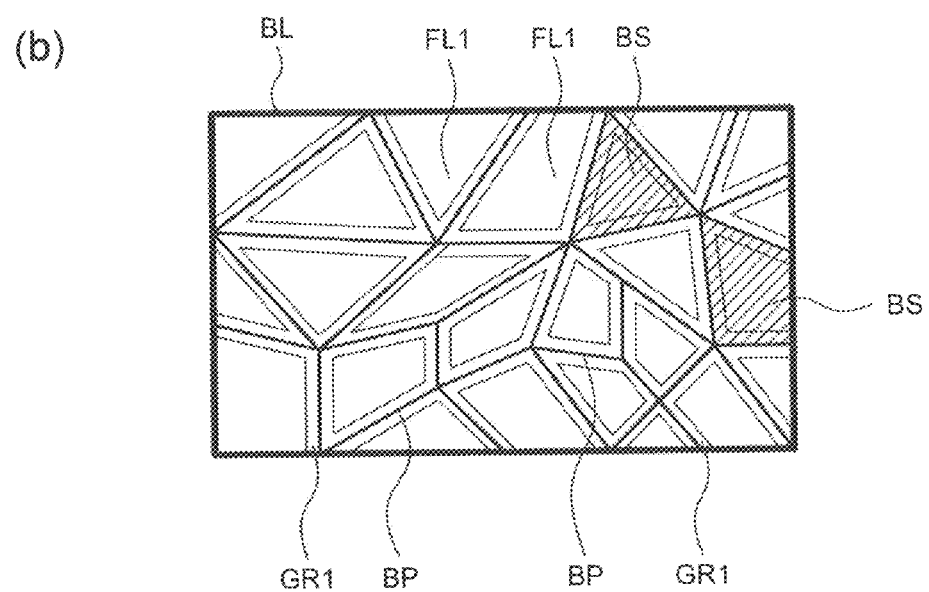

Embodiments of the present invention will now be described in detail hereinbelow. In this specification, an identical reference numeral is assigned to identical constituent elements.

First Embodiment

FIG. 1(a) is a cross-sectional view illustrating a structure of a semiconductor light-emitting element (hereinafter, simply referred to as "light-emitting element" or "element" in some cases) 10 according to a first embodiment. In the structure of the semiconductor light-emitting element 10, a semiconductor structure layer SL is formed on a mounting substrate (hereinafter, simply referred to as "substrate" in some cases) 11. The semiconductor structure layer SL includes an n-type semiconductor layer (i.e. first semiconductor layer) 12 formed on the mounting substrate 11, a light-emitting functional layer 13 formed on the n-type semiconductor layer 12, an electron blocking layer 14 formed on the light-emitting functional layer 13, and a p-type semiconductor layer (i.e. second semiconductor layer whose conductivity type is opposite to the conductivity type of the first semiconductor layer 12) 15 formed on the electron blocking layer 14.

According to this embodiment, the mounting substrate 11 is composed of a growth substrate used for growth of, for example, the semiconductor structure layer SL, and is made of sapphire, for example. In addition, the semiconductor structure layer SL is composed of a nitride-based semiconductor. The semiconductor light-emitting element 10 can be manufactured by growing the semiconductor structure layer SL on the sapphire substrate, for example, whose C-plane surface serves as a crystal growth surface, using the Metal Organic Chemical Vapor Deposition (MOCVD) method. Although not illustrated in the drawings, the light-emitting element 10 has an n-electrode and a p-electrode that apply voltage to the n-type semiconductor layer 12 and the p-type semiconductor layer 15, respectively.

The embodiment is illustrated with reference to the structure of the light-emitting element 10 where the semiconductor structure layer SL is formed on a growth substrate serving as the mounting substrate 11. However, the embodiment is not limited to the structure where the mounting substrate 11 is the growth substrate. For example, the semiconductor light-emitting element 10 may have a structure obtained by first growing the semiconductor structure layer SL on a growth substrate, bonding the semiconductor structure layer SL to another substrate, and removing the growth substrate. In this case, the other substrate thus bonded is formed on the p-type semiconductor layer 15. The aforementioned bonded substrate may use materials with a high degree of heat dissipation, such as, Si, AlN, Mo, W, and CuW.

Although not illustrated in the drawings, a buffer layer (or underlayer) may be provided between the mounting substrate 11 and the n-type semiconductor layer 12. The buffer layer is, for example, provided for the purpose of mitigating the strain possibly generated on the interface between the growth substrate and the semiconductor structure layer SL as well as on the interface between layers of the semiconductor structure layer SL. In this embodiment, after a GaN layer is grown on a sapphire substrate (mounting substrate 11) as a buffer layer, the n-type semiconductor layer 12 is laminated.

The n-type semiconductor layer 12 is composed of, for example, a GaN layer containing an n-type dopant (for example, Si). The electron blocking layer 14 is composed of, for example, an AlGaN layer. The p-type semiconductor layer 15 is composed of, for example, a GaN layer containing a p-type dopant (for example, Mg). The n-type semiconductor layer 12 may include a plurality of n-type semiconductor layers with different dopant concentrations. The electron blocking layer 14 may contain a p-type dopant. The p-type semiconductor layer 15 may have a contact layer on the principal surface opposite to the interface with respect to the electron blocking layer 14.

The light-emitting functional layer 13 may have a plurality of light-emitting layers. However, in this embodiment, the case where the light-emitting functional layer 13 is composed of a single light-emitting layer will be described. Therefore, in this embodiment, the light-emitting layer 13 serving as the light-emitting functional layer 13 will be described. The light-emitting layer 13 is formed on the n-type semiconductor layer 12 and has a quantum well (QW) structure.

The light-emitting layer 13 has a base layer BL with a different composition from that of the n-type semiconductor layer 12. The base layer BL has a groove (hereinafter referred to as "first groove") GR1 formed in a random net shape due to stress (strain) from the n-type semiconductor layer 12. In other words, the first groove GR1 has a mesh shape formed by a plurality of combined grooves created by stress strain generated in the base layer BL due to the composition difference between the n-type semiconductor layer 12 and the base layer BL. The stress strain generated in the base layer BL is strain of the crystal structure of the base layer BL caused by the lattice constant difference between the n-type semiconductor layer 12 and the base layer BL.

The light-emitting layer 13 has a quantum well structure layer QWL composed of a quantum well layer WA formed on the base layer BL and a barrier layer BA. The quantum well layer WA is formed on the base layer BL, and the barrier layer BA is formed on the quantum well layer WA. The base layer BL serves as a barrier layer for the quantum well layer WA. The quantum well layer WA is formed as a strained quantum well layer.

A description will now be made for the base layer BL with reference to FIG. 1(b). FIG. 1(b) is a diagram schematically illustrating the upper surface of the base layer BL. The base layer BL is partitioned by the first groove GR1 and has many fine base segments BS formed to have random sizes. Each of the base segments BS is partitioned in a random net shape since the base layer BL has a composition subject to stress strain from the n-type semiconductor layer 12.

The first groove GR1 is composed of groove portions with random and different lengths and shapes. The first groove GR1 is formed in a net (mesh) shape all over the surface of the base layer BL. Each of the base segments BS is a portion (segment) that is randomly partitioned and formed by the first groove GR1 within the base layer BL. Furthermore, the upper surfaces of the base segments BS have various shapes, such as a substantially round shape, a substantially oval shape, and a polygonal shape.

The first groove GR1 has, for example, a V-shaped cross section (FIG. 1(a)). Also, as illustrated in FIG. 1(b), the first groove GR1 has a line-like bottom portion BP. In this embodiment, an end portion of each of the base segments BS is the bottom portion BP of the first groove GR1. Each of the base segments BS adjoins to another base segment BS at the bottom portion BP.

Further, the base layer BL has a flat portion (hereinafter referred to as "first flat portion") FL1, which corresponds to each of the base segments BS. The surface of the base layer BL is composed of the first flat portion FL1 and the inner wall surface of the first groove GR1. Each of the first flat portions FL1 is partitioned by the first groove GR1 for each base segment BS. The base segment BS has an upper surface composed of the first flat portion FL1 and a side surface composed of the inner wall surface of the first groove GR1.

In other words, the first flat portion FL1 constitutes the upper surface of each of the base segments BS, and the inner wall surface of the first groove GR1 constitutes the side surface of the base segment BS. Each of the base segments BS thus has an inclined side surface and has a cross section with, for example, a substantially trapezoidal shape.

The light-emitting layer 13 has, on its surface, a groove (hereinafter referred to as "second groove") GR2 that is formed to inherit (i.e., retain) the shape of the first groove GR1 and has the same mesh shape as that of the first groove GR. Specifically, as illustrated in FIG. 1(a), the quantum well layer WA and the barrier layer BA are formed on the base layer BL with the segmental shape of the base segment BS retained. Thus, the quantum well layer WA and the barrier layer BA have a groove at a location corresponding to each groove portion of the first groove GR1 of the base layer BL. A groove formed in the barrier layer BA, which is the nearest layer to the p-type semiconductor layer 15, is the second groove GR2.

The portion of the surface of the light-emitting layer 13, i.e. the surface of the barrier layer BA, other than the second groove GR2 is formed as a flat portion (hereinafter, referred to as "second flat portion") FL2. Each of the second flat portions FL2 is formed so that its location and shape correspond to those of each of the first flat portions FL1.

In other words, the light-emitting layer 13 has the second flat portion FL2 and the second groove GR2 on its surface. The second groove GR2 is formed so as to partition the light-emitting layer 13 into a plurality of island-shaped light-emitting segments ES. Each of the light-emitting segments ES is formed so as to correspond to each of the base segments BS. In other words, each of the light-emitting segments ES is partitioned so as to be randomly net-shaped on the surface of the light-emitting layer 13. The sizes and shapes of the light-emitting segments ES are randomly varied and distributed.

Figure 2:
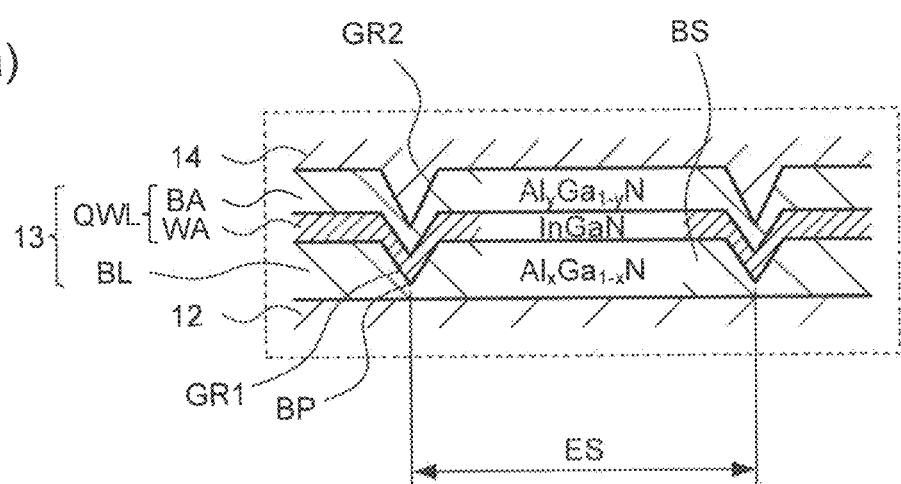
FIG. 2(a) is a cross-sectional view illustrating a structure of the light-emitting layer of the semiconductor light-emitting element according to the first embodiment.
FIG. 2(b) and FIG. 2(c) are cross-sectional views illustrating example compositions of a base layer and a barrier layer.
Figure 2:
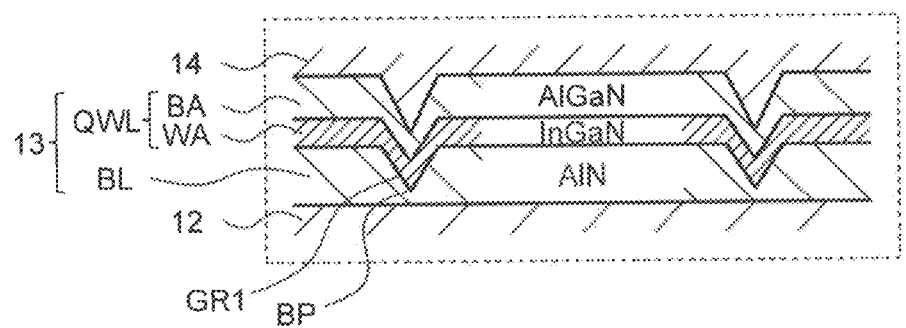
Figure 2:
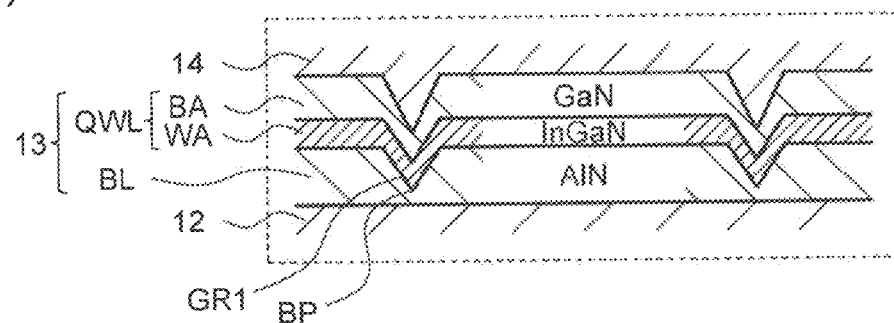

FIG. 2(a) is a cross-sectional view illustrating the structure of the light-emitting layer 13. FIG. 2 includes partially enlarged cross-sectional views where the portion of FIG. 1(a) surrounded by the dashed line is enlarged. A description will now be made for the light-emitting layer 13 in more detail with reference to FIG. 2(a). The base layer BL of the light-emitting layer 13 has a composition of $Al_xGa_{1-x}N$ ($0 \le x \le 1$). The quantum well layer WA has a composition of InGaN. The barrier layer BA has a composition of $Al_yGa_{1-y}N$ ($0 \le y < 1$).

The barrier layer BA has an Al composition y which is smaller than that of the base layer BL. Specifically, the Al composition y of the barrier layer BA is smaller than the Al composition x of the base layer BL. In other words, the composition x and the composition y satisfy a relationship of x>y.

FIG. 2(b) and FIG. 2(c) illustrate example compositions of the base layer BL and the barrier layer BA. For example, as illustrated in FIG. 2(b), the base layer BL has a composition of AlN, and the barrier layer BA has a composition of AlGaN (i.e., x=1 and 0<y<1). Also, for example, as illustrated in FIG. 2(c), the base layer BL has a composition of AlN, and the barrier layer BA has a composition of GaN (i.e., x=1 and y=0).

A description will now be made for the light-emitting layer 13. In this embodiment, the base layer BL is composed of an AlN layer. The base segment BS (i.e., the first groove GR1) of the base layer BL can be formed, for example, by growing an AlN layer serving as the base layer BL on the n-type semiconductor layer 12 at a relatively low temperature.

More specifically, when a base layer BL different from the n-type semiconductor layer 12 in terms of crystal composition is grown on the n-type semiconductor layer 12, stress (strain) is generated in the base layer BL. For example, the base layer BL has a smaller lattice constant than that of the n-type semiconductor layer 12. For example, when an AlN layer serving as the base layer BL is formed on a GaN layer serving as the n-type semiconductor layer 12, tensile strain is generated in the AlN layer due to the GaN layer. Thus, tensile stress is generated in the AlN layer during its growth. When the AlN layer is grown on the GaN layer, a groove is formed in the AlN layer at the beginning of or during its growth, and the AlN layer grows in a three-dimensional manner. Accordingly, the AlN layer is grown in a stereoscopic manner, and a plurality of fine protrusions and recesses are formed. The starting point of formation of this groove is the bottom portion BP of the first groove GR1.

When the AlN layer is grown on the GaN layer at a low temperature, three-dimensional growth of the AlN layer is promoted. Thus, a large number of groove portions are formed (the first groove GR1 is formed) on the surface of the AlN layer while being combined with each other, whereby the surface of the AlN layer is partitioned into a plurality of segments. The base layer BL with the plurality of base segments BS can thus be formed. In this embodiment, the AlN layer is formed as the base layer BL at a growth temperature of 745° C.

When an InGaN layer serving as the quantum well layer WA is formed on the base layer BL, the quantum well layer WA is formed as a strained quantum well layer. Also, a certain distribution of the In content is generated within the quantum well layer WA. In other words, the quantum well layer WA is formed such that, for example, the region on the first flat portion FL1 differs from the region on the first groove GR1 in terms of In composition. The layer thickness of the quantum well layer WA on the upper surface of the base segment BS is different from that on the side surface of the base segment BS. Thus, the band gap is not constant within the layer of the quantum well layer WA. As the light-emitting layer 13 has fine island-shaped protrusions and recesses, the light-emitting layer 13 emits various colors of light.

As the size of the base segment BS decreases, the amount of In introduced into the quantum well layer WA increases, and the light-emitting wavelength shifts toward the longer wavelength side. Specifically, when an InGaN layer serving as the quantum well layer WA is formed on the AlN layer serving as the base layer BL, compressive strain is exerted on the InGaN layer by the AlN layer. When the InGaN layer is subject to compressive strain, In is readily introduced into the InGaN layer. Thus, by forming an InGaN layer on the base layer BL having a high Al composition, an InGaN layer with a high In composition can be formed.

This decreases the band gap of the InGaN layer, i.e., the energy between quantum levels. The quantum well layer WA emits light with a light-emitting wavelength on the longer wavelength side. In this embodiment, the light-emitting layer 13 emits light whose intensity peaks in a region on the longer wavelength side with respect to the blue region.

Also, in this embodiment, the Al composition y of the barrier layer BA is smaller than the Al composition x of the base layer BL. Therefore, the barrier layer BA has a smaller band gap than that of the base layer BL, which causes an increase in the recombination probability of an electron and a hole.

More specifically, to the light-emitting layer 13, electrons are injected from the n-type semiconductor layer 12, and holes are injected from the p-type semiconductor layer 15. Furthermore, the mobility of an electron is higher than that of a hole. As described above, with respect to the light-emitting layer 13, the band gap of the layer on the p-type semiconductor layer 15 side (i.e., barrier layer BA) is smaller than that of the layer of the n-type semiconductor layer 12 side (i.e., base layer BL). Thus, the difference in terms of transportation efficiency between the electron and the hole decreases, and the probability of recombination between the two increases.

It is preferable that the base layer BL have a layer thickness that contributes to production of the tunnel effect of a carrier. For example, the tunnel effect of a carrier is caused by decreasing the layer thickness of the base layer BL. The base layer BL, which has a greater band gap than that of the n-type semiconductor layer 12, inhibits transportation of an electron to the quantum well layer WA. By adjusting the layer thickness of the base layer BL and producing the tunnel effect, transportation of an electron to the quantum well layer WA is promoted, and the recombination probability with a hole (i.e., light-emitting efficiency) increases.

Thus, light emitted from the light-emitting layer 13 has a wide light-emitting wavelength range and a high light-emitting intensity. The light-emitting layer 13 is made to have high color rendering properties and emits light with a high light-emitting intensity.

In this embodiment, the base segment BS of the base layer BL has the first flat portion FL1. The surface of the light-emitting layer 13 has a first flat portion FL2. The entire light-emitting layer 13 ensures a preferable level of crystallinity.

In this embodiment, the case where the surface of the base layer BL is composed of the first flat portion FL1 and the first groove GR1 was illustrated. However, the surface configuration is not limited to the aforementioned case. For example, the base layer BL may have a curved surface portion on the upper surface of the base segment BS.

Also, the present inventors examined formation of not a light-emitting layer like the light-emitting layer 13, but of a multiple quantum well structure having a plurality of quantum well layers which have one flat surface and in which the In composition is changed differently from one another. However, the range of the In composition that can be formed is limited. In the case of a light-emitting element having a light-emitting layer of a multiple quantum well structure with In compositions changed, the spectrum with a wavelength band as wide as that of the light-emitting element 10 of this embodiment was not possible. Specifically, light with a constant wavelength and a certain level of intensity over a wide range was not acquired.

Therefore, light with high color rendering properties could not be acquired by simply increasing the In composition. When a quantum well layer with an excessively large In composition was formed to change the In composition in a wide range, segregation of In was noticeable, and In precipitated and blackened. Also, a portion that does not function as a light-emitting layer was formed. Thus, it can be said that there is a limit in the effort to simultaneously achieve a wider light-emitting spectrum and a higher light-emitting intensity based on the In composition.

In another example examination, the present inventors manufactured a light-emitting element by laminating light-emitting layers that are made of different materials and have different band gaps. Simply laminating materials of different types to produce a light-emitting layer only produced light whose peak wavelength corresponds to the band gap, and the spectral intensity between the peaks was small. Acquisition of white light was difficult since colors were mixed in an unbalanced and unstable manner. A step of forming light-emitting layers containing different types of materials was added, and the resulting product did not have a preferable level of crystallinity. In this embodiment, on the other hand, by forming a light-emitting functional layer 13 having a quantum well layer WA of a microstructure, light that has a light-emitting wavelength band (half-value width) over a wide range of the visible region was readily and certainly achieved.

As one example embodiment, the present inventors formed a light-emitting layer 13 having the following layer thicknesses. The layer thickness of the base layer BL was 4 nm, and the layer thickness of the quantum well layer WA was 3 nm. When the barrier layer BA was made of a GaN layer, the layer thickness of the GaN layer was 7 nm. When the barrier layer BA was made of an AlGaN layer, the layer thickness of the AlGaN layer was 4 nm. The size of the base segment BS in the in-plane direction ranged from several tens nm to several μm.

As the Al composition y increases, the acquired spectral peak shifts toward the long wavelength side. This means that light-emitting color can be adjusted by adjusting the Al composition y in various manners. There are two possible causes for this. Firstly, the stress strain generated in the quantum well layer WA increases as the Al composition y increases. The internal electric field of the quantum well layer WA increases with an increase in the stress strain generated in the quantum well layer WA. The band of the quantum well layer WA thus inclines, and the actual band gap decreases. The second cause is the difference in the level of diffusion of In into the barrier layer BA. As the Al composition y of the barrier layer BA decreases, the ease of diffusion of In from the quantum well layer WA to the barrier layer BA increases. Therefore, the actual In content in the quantum well layer WA decreases.

In this embodiment, the case where one quantum well layer WA and one barrier layer BA are formed has been described. However, the number of the quantum well layers WA and that of the barrier layers BA are not limited to the aforementioned case. For example, a plurality of the quantum well layers WA and a plurality of the barrier layers BA may be formed. In other words, the quantum well structure layer QWL needs to have at least one quantum well layer WA and at least one barrier layer BA. More specifically, on the base layer BL, the light-emitting layer 13 needs to have the structure where at least one quantum well layer WA and at least one barrier layer BA are alternately laminated.

FIRST MODIFIED EXAMPLE

Figure 3:
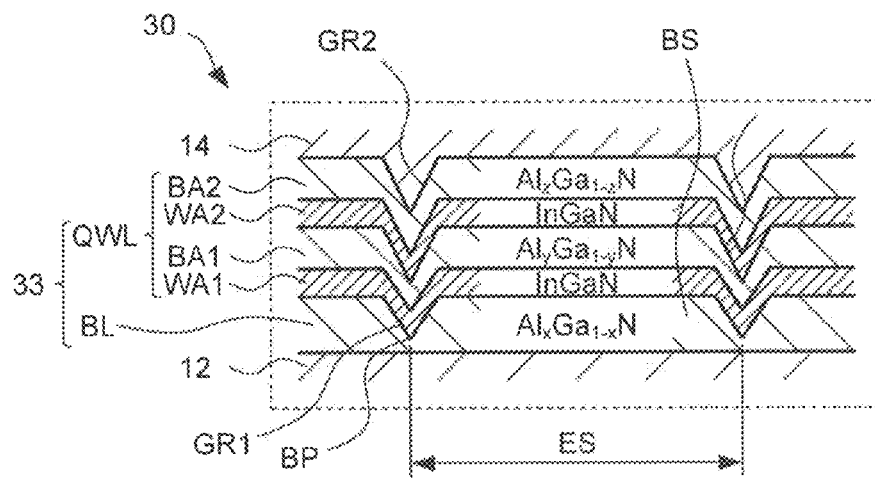
FIG. 3(a) is a cross-sectional view illustrating a structure of a light-emitting layer of a semiconductor light-emitting element according to a first modified example of the first embodiment.
FIG. 3(b) and FIG. 3(c) are cross-sectional views illustrating example compositions of a base layer and a barrier layer.
Figure 3:
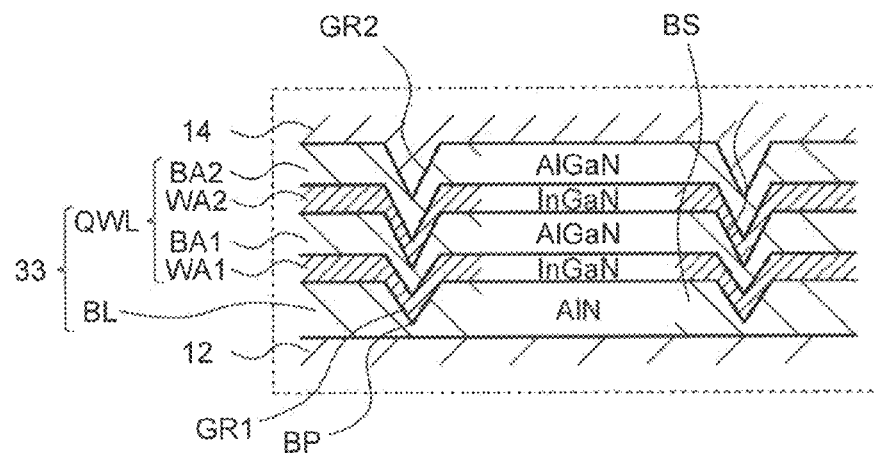
Figure 3:
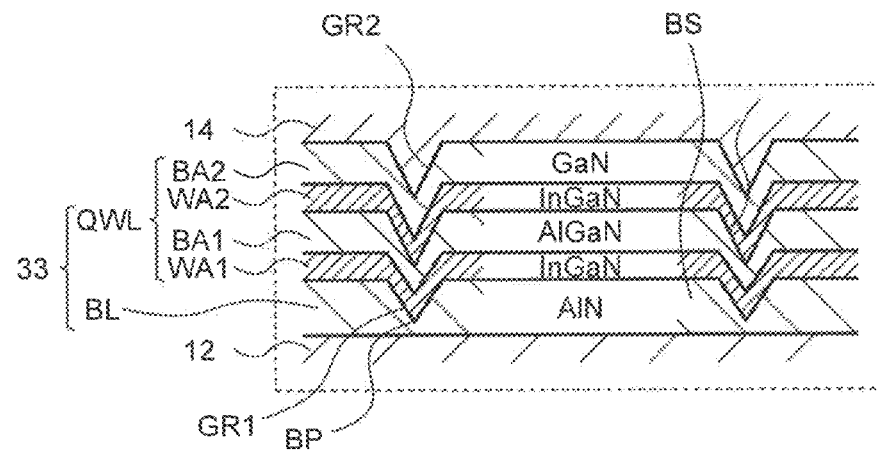

FIG. 3(a) is a cross-sectional view illustrating a structure of a semiconductor light-emitting element 30 according to a first modified example of the first embodiment. Except for the structure of a light-emitting functional layer (light-emitting layer) 33, the configuration of the light-emitting element 30 is the same as that of the light-emitting element 10. In the structure of the light-emitting layer 33, on the base layer BL, a plurality of quantum well layers WA1 and WA2 (two in this modified example) and a plurality of barrier layers BA1 and BA2 (two in this modified example) are alternately laminated. In other words, the light-emitting layer 33 has the quantum well structure layer QWL of a multiple quantum well (MQW) structure. In this modified example, the quantum well layers WA1 and WA2 have the same composition, for example, an InGaN composition.

In this modified example, the barrier layers BA1 and BA2 are configured such that the Al composition decreases as the distance to the p-type semiconductor layer 15 decreases. More specifically, the barrier layer BA1 has a composition of $Al_yGa_{1-y}N$ ($0 \le y < 1$), and the barrier layer BA2 has a composition of $Al_zGa_{1-z}N$ ($0 \le z \le 1$). The compositions y and z satisfy the relation y>z and the Al composition x of the base layer BL satisfies the relation x>y>z.

Example compositions of the base layer BL and the barrier layers BA1 and BA2 are illustrated in FIGS. 3(b) and 3(c). For example, as illustrated in FIG. 3(b), the base layer BL is an AlN layer, and the barrier layer BA1 is an AlGaN layer. Also, the barrier layer BA2 is an AlGaN layer whose Al composition z is smaller than that of the barrier layer BA1 (i.e., x=1, 0<y<1, and 0<z<1, y>z). For example, as illustrated in FIG. 3(c), the base layer BL is an AlN layer, the barrier layer BA1 is an AlGaN layer, and the barrier layer BA2 is a GaN layer (specifically, x=1, 0<y<1, and z=0). In this modified example, the layer thickness of the barrier layers BA1 and BA2 was 4 nm.

The barrier layers BA1 and BA2 need to be configured so that the Al composition decreases as the distance to the p-type semiconductor layer 15 decreases. A plurality of barrier layers that have an identical Al composition in which, for example, the relationship of x=y>z or x>y=z holds true in the compositions x, y, and z, may be included.

In this modified example, the base layer BL and the barrier layers BA1 and BA2 are formed so that the Al composition gradually decreases in the direction from the n-type semiconductor layer 12 to the p-type semiconductor layer 15. As the base layer BL and the barrier layers BA1 and BA2 are thus configured, the efficiency of injecting holes into the light-emitting layer 33 can be adjusted with a high degree of freedom.

By decreasing the Al composition toward the p-type semiconductor layer 15, the hue of emitted light can be readily designed. The reason is that the quantum well layers WA1 and WA2 are subject to stress strain from both the barrier layers on the upper and lower sides and the level of stress strain affects each of the Al compositions of the barrier layers. For example, when each layer has a different Al composition, a quantum well layer is formed such that the lower barrier layer is greater than the upper barrier layer in terms of Al composition, and a further quantum well layer is formed such that the upper barrier layer is greater than the lower barrier layer in terms of Al composition. In this case, the magnitude of the total stress strain exerted on each quantum well layer cannot be determined, which causes difficulties for light-emitting wavelength design. On the contrary to this, as in the case of this modified example, by decreasing the Al composition toward the p-type semiconductor layer 15, the wavelength of light emitted from each quantum well layer of a multiple quantum well to the p-type semiconductor layer 15 can be shortened. Accordingly, a simple and readily designable structure can be achieved. Also, a multiple quantum well structure further increases the light-emitting efficiency. Therefore, high color rendering properties and a high light-emitting intensity are simultaneously achieved.

SECOND MODIFIED EXAMPLE

Figure 4:
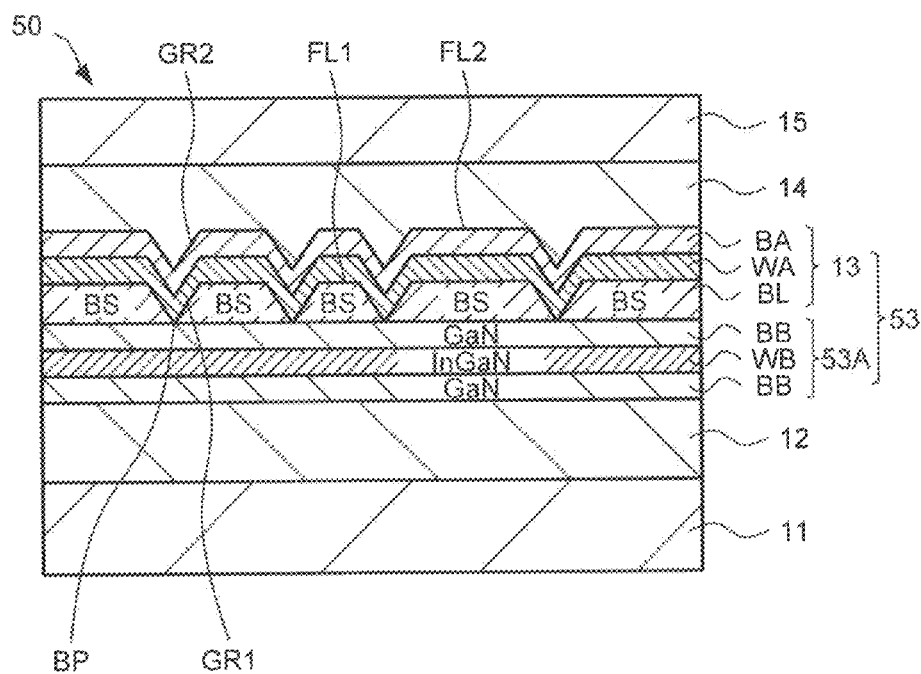
FIG. 4 is a cross-sectional view illustrating a structure of a semiconductor light-emitting element according to a second modified example of the first embodiment.

FIG. 4 is a cross-sectional view illustrating a structure of a semiconductor light-emitting element 50 according to a second modified example of the first embodiment. Except for the structure of the light-emitting functional layer 53, the configuration of the light-emitting element 50 is the same as that of the light-emitting element 10. Between the n-type semiconductor layer 12 and the light-emitting layer (first light-emitting layer) 13 of the light-emitting element 10, the light-emitting functional layer 53 has a light-emitting layer (second light-emitting layer) 53A in which at least one quantum well layer WB and a plurality of barrier layers BB are alternately laminated.

According to this modified example, the light-emitting layer 53A has a structure in which the uniformly flat quantum well layer WB is held between the two barrier layers BB on the n-type semiconductor layer 12. On the barrier layer BB that is closest to the p-type semiconductor layer 15, the light-emitting layer 13 (base layer BL) is formed. The quantum well layer WB has a composition, for example, an InGaN composition, which is identical to that of, for example, the quantum well layer WA. Each of the barrier layers BB has a composition, for example, a GaN composition, which is identical to that of the n-type semiconductor layer 12.

According to this modified example, the light-emitting layer 53A of a quantum well structure is added to the side of the n-type semiconductor layer 12 of the light-emitting layer 13 in the light-emitting element 10 according to the first embodiment. Compared with the first embodiment, additional light with a light-emitting wavelength peak in a pure blue region can be readily emitted. The configuration according to this embodiment is advantageous for, for example, increasing the light intensity in the blue region.

Figure 5:
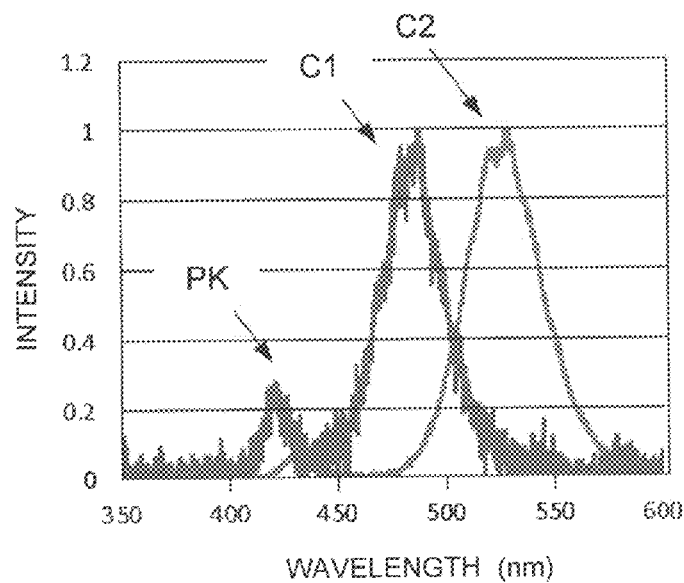
FIG. 5 is a diagram illustrating a spectrum from the semiconductor light-emitting element according to the second modified example of the first embodiment.

FIG. 5 illustrates the spectral curve from the light-emitting functional layer 53 in the semiconductor light-emitting element 50 when the barrier BA is formed of a GaN layer and when the barrier BA is formed of an AlN layer. The configuration where the barrier layer BA is composed of an AlN layer is equivalent to the configuration where x=y=1 is satisfied in the compositions x and y. A curve C1 denotes a spectral curve when the barrier layer BA is formed of a GaN layer. A curve C2 denotes a spectral curve when the barrier layer BA is formed of an AlN layer.

As can be seen from those illustrated in FIG. 5, as the Al composition of the barrier layer BA increases, the peak of the spectral intensity of the acquired light is shifted to the long wavelength side. The peak wavelengths of the two curves is shifted from the blue region, and the light-emitting wavelength bands are broad. A peak PK at approximately 420 nm is caused by light emitted from the light-emitting layer 53A. The location of the peak PK is the same in the two curves. In the curve C1, the location of the peak in the long wavelength region is distant (far) from that of the peak PK in the blue region. These two peaks are relatively near in the curve C2. It is confirmed on the basis of the foregoing that the hue of the color of emitted light can be adjusted by adjusting the Al composition of the barrier layer BA.

The case of forming the electron blocking layer 14 between the light-emitting functional layer 13, 33 and 53 and the p-type semiconductor layer 15 was described in this embodiment. However, this embodiment is not limited to the case of providing the electron blocking layer 14. For example, the p-type semiconductor layer 15 may be formed on the light-emitting functional layer 13. Also, the electron blocking layer 14 has a larger band gap than those of the n-type semiconductor layer 12 and the p-type semiconductor layer 15. Accordingly, an electron can be prevented from overflowing to the side of the p-type semiconductor layer 15 through the light-emitting functional layer 13. Therefore, it is preferable to dispose the electron blocking layer 14 for large-current driving and high-temperature operation.

The first embodiment and the first and second modified examples may be combined with each other. For example, the light-emitting layer 53A may be formed under the light-emitting functional layer 33. Also, the light-emitting layers 13 and 33 can be laminated.

In the embodiment and the modified examples thereof, the light-emitting functional layer 13 has the base layer BL and the quantum well structure layer QWL formed on the base layer BL, wherein: the base layer BL has a composition subject to stress strain from the n-type semiconductor layer 12 and has a plurality of the base segments BS that are partitioned in a random net shape; and the quantum well structure layer QWL is composed of at least one quantum well layer WA and at least one barrier layer WB. In addition, the light-emitting layer 13 has the second groove GR2 that partitions the light-emitting layer 13 into a plurality of island-shaped light-emitting segments ES that are formed in a random net shape.

The base layer BL has a composition of $Al_xGa_{1-x}N$ ($0 \le x \le 1$). The at least one barrier layer BA has a composition of $Al_yGa_{1-y}N$ ($0 \le y < 1$), and the composition x and composition y satisfy the inequality of x>y. Accordingly, it is possible to provide a light-emitting element that can emit light with a high light-emitting intensity over a wide range of the visible wavelength region.

In this embodiment, the case where the first conductivity type is an n-conductivity type and the second conductivity type is a p-conductivity type, which is opposite to the n-conductivity type. However, the first conductivity type may be a p-type, and the second conductivity type may be an n-type.

REFERENCE SIGNS LIST 10, 30, 50 semiconductor light-emitting element
12 n-type semiconductor layer (first semiconductor layer)
13, 33, 53 light-emitting functional layer (light-emitting layer)
53A light-emitting layer
14 electron blocking layer
15 p-type semiconductor layer (second semiconductor layer)
BL base layer
WA, WA1, WA2 quantum well layer
BA, BA1, BA2 barrier layer
GR1, GR2 first and second grooves

The invention claimed is:

1. A semiconductor light-emitting element comprising:
a first semiconductor layer of a first conductivity type;
a light-emitting functional layer that is formed on the first semiconductor layer and includes a light-emitting layer; and
a second semiconductor layer that is formed on the light-emitting functional layer and is of a conductivity type opposite to a conductivity type of the first semiconductor layer,
wherein:
the light-emitting layer includes: a base layer which has a composition subject to stress from the first semiconductor layer and has a plurality of base segments that are partitioned in a random net shape; and a quantum well structure layer formed on the base layer and composed of at least one quantum well layer and at least one barrier layer, and
the base layer has a composition of $Al_xGa_{1-x}N$ ($0 \le x \le 1$), the at least one barrier layer has a composition of $Al_yGa_{1-y}N$ ($0 \le y < 1$), wherein x and y satisfy a relation of x >y.

2. The semiconductor light-emitting element according to claim 1, wherein the first semiconductor layer has a composition of GaN, and the at least one quantum well layer has a composition of InGaN.

3. The semiconductor light-emitting element according to claim 1, wherein:
the quantum well structure layer has a multiple quantum well structure, and
each barrier layer of the multiple quantum well structure is formed such that an Al composition decreases as a distance to the second semiconductor layer decreases.

4. The semiconductor light-emitting element according to claim 1, wherein the base layer has a layer thickness that causes a tunnel effect of a carrier.

5. The semiconductor light-emitting element according to claim 1, wherein the base layer has an AlN composition, and a barrier layer of the at least one barrier layer located closest to the second semiconductor layer has a GaN composition.

6. The semiconductor light-emitting element according to claim 1, wherein between the first semiconductor layer and the light-emitting layer, the light-emitting functional layer has another light-emitting layer composed of at least one quantum well layer and a plurality of barrier layers.

* * * * *